United States Patent [19]

Hafeman

[11] Patent Number: 4,758,786

[45] Date of Patent: Jul. 19, 1988

[54] METHOD OF ANALYZING SEMICONDUCTOR SYSTEMS

[75] Inventor: Dean G. Hafeman, San Bruno, Calif.

[73] Assignee: Molecular Devices Corporation, Palo Alto, Calif.

[21] Appl. No.: 893,926

[22] Filed: Aug. 6, 1986

[51] Int. Cl.[4] .......................................... G01R 31/28
[52] U.S. Cl. ............................ 324/158 D; 324/158 R; 324/73 R
[58] Field of Search ............... 324/457, 158 R, 158 D; 356/237; 136/290

[56] References Cited

U.S. PATENT DOCUMENTS

| 3,840,809 | 10/1974 | Yun | 324/158 D X |
| 3,995,216 | 11/1976 | Yun | 324/158 R X |
| 4,287,473 | 9/1981 | Sawyer | 324/158 D X |
| 4,323,842 | 4/1982 | McGarrity et al. | 324/158 R X |
| 4,325,025 | 4/1982 | Corcoran et al. | 324/158 R X |
| 4,698,587 | 10/1987 | Burns et al. | 324/158 D X |

OTHER PUBLICATIONS

Cape et al., "Automated Measurement System for Solar Cell Optical Characterization Studies of GaAs and Multijunction Cascade Cells", 1981, IEEE; pp. 1195–1198.
Wheeler et al., J. Electronchem. Soc., "Semiconductor Electrodes: Differential Photocurrent Determination of Absorption Coefficient and Diffusion Length in p-GaP Photoelectrochemical Cells" (May 1984) 131:1038–1045.
Wheeler et al., J. Electrochem. Soc., "Semiconductor Electrodes: Differential Photocurrent and Second Harmonic Techniques for in situ Monitoring of Surface States on n-MoSe$_2$ in Aqueous Solutions" (Oct. 1984) 131:2289–2294.
Eetemadi et al., J. Appl. Phys., "Reexamination of the wavelength modulation photoresponse spectrosopies" (Nov. 1985) 58:3856–3859.
Sharma et al., J. Appl. Phys., "Infrared photoionization of interface states in Cr-SiO$_2$-(n,p)Si structures" (Feb. 1985) 57:1186–1189.
Greve et al., Appl. Phys. Lett., "Photoionization cross section and density of interface states in MOS structures" (Jun. 1980), 36:1002–1004.
Li et al., "Surface Recombination at Semiconductor Electrodes: Steady-State and Intensity Modulated Photocurrent Response", (1985).
44Petit et al., "Light Modulation Induced Electrical Resonance (LMIER) Application to the Determination of the Flatband Potential", (1983).

Primary Examiner—Reinhard J. Eisenzopf
Assistant Examiner—Vinh P. Nguyen
Attorney, Agent, or Firm—Bertram I. Rowland; Steven F. Caserza

[57] ABSTRACT

A method of analyzing selected regions of semiconductor systems to determine the uniformity of distribution of trapped charges or electric dipoles at the surface of the semiconductor or in a dielectric or insulating material associated therewith, the method including the steps of applying an adjustable bias potential to the semiconductor system to produce an electric field within the system; directing a beam of electromagnetic radiation onto a selected region of the semiconductor system in which the electric field exists to induce a photocurrent output from the system, the beam including photons of energy greater than the band gap energy of the semiconductor; adjusting the bias potential to vary the direction and/or the magnitude of the electric field; measuring the photocurrent output induced by the beam as a function of the bias potential; and determining the uniformity of distribution of trapped charges or electric dipoles in the selected region of the semiconductor system from the measured photocurrent output. The measured current may be an alternating photocurrent produced by the additional step of modulating the intensity of the beam; in this case, either the amplitude or the phase (with respect to light intensity modulation) of the induced alternating photocurrent may be measured, as a function of the applied bias potential.

23 Claims, 8 Drawing Sheets

METHOD OF ANALYZING SEMICONDUCTOR SYSTEMS

BACKGROUND OF THE INVENTION

The present invention relates generally to methods of analyzing selected regions of conductor-insulator-semiconductor systems or other semiconductor systems.

Many semiconductor devices require a high quality, well-characterized interface between a conductor and a semiconductor. Examples of such devices are field-effect transistors, computer memory devices, charge-coupled devices, Schottky diodes, and most integrated circuits. Most of these devices are conductor-insulator-semiconductor (CIS) devices. In most CIS devices the conductor is a metal, and thus such devices are commonly referred to as MIS, (metal-insulator-semiconductor) devices. When the semiconductor is silicon and the insulator is silicon oxide, these devices are referred to by the acronym MOS.

In most of these semiconductor devices it is desirable to have no trapped charges in the region between the metal conductor and the semiconductor. Also, it is usually desirable to minimize structural defects, which are often manifest as electric dipoles or trapped charges within the semiconductor or near the interface with either the insulator or the conductor. If trapped charges or defects are present, in most semiconductor devices they should be uniformly distributed so as to produce a uniform electric field or electronic band bending within the semiconductor.

SUMMARY OF THE INVENTION

One important object of this invention is to provide an improved method of assaying specimens of semiconductor material, which method is capable of accurately determining the uniformity of distribution of trapped charges or electric dipoles at the surface of the semiconductor or in a dielectric or insulating material associated therewith. In this connection, a related object of the invention is to provide such a method in which the selected region of the semiconductor material that is assayed can be as small as a few microns or as large as the entire specimen.

Another important object of this invention is to provide an improved method of assaying extremely small selected regions of a semiconductor system.

A further object of the invention is to provide a semiconductor assaying method of the foregoing type which is non-destructive.

In accordance with the present invention, the foregoing objectives are realized by providing a method of analyzing selected regions of semiconductor systems to determine the uniformity of distribution of trapped charges or electric dipoles at the surface of the semiconductor or in a dielectric or insulating material associated therewith, the method comprising the steps of applying an adjustable bias potential to the semiconductor system to produce an electric field within the system; directing a beam of electromagnetic radiation onto a selected region of the semiconductor system in which the electric field exists to induce a photocurrent output from the system, the beam comprising photons of energy greater than the band gap energy of the semiconductor; adjusting the bias potential to vary the direction and/or the magnitude of the electric field; measuring the photocurrent output induced by the beam as a function of the bias potential; and determining the uniformity of distribution of trapped charges or electric dipoles in the selected region of the semiconductor system from the measured photocurrent output. The measured current may be an alternating photocurrent produced by the additional step of modulating the intensity of the beam; in this case, either the amplitude or the phase (with respect to light intensity modulation) of the induced alternating photocurrent may be measured, as a function of the applied bias potential.

DESCRIPTION OF THE SPECIFIC EMBODIMENTS

According to the present invention, the nonuniformity of the distribution of trapped charges in a CIS device or the nonuniformity of the distribution of structural defects in a conductor-semiconductor device is determined by measuring the photocurrent as a function of the applied bias potential while the bias potential is adjusted through a range that includes the flat-band potential of the device, and then determining the deviation of the measured current characteristic from a predetermined current characteristic representing a conductor-insulator-semiconductor or conductor-semiconductor device with uniformly distributed trapped charges or no trapped charges. The photocurrent response of the semiconductor system to irradiation of the system is indicative of the effect of the distribution of any trapped charges or electric dipoles on the flat-band potential of the device.

Unlike the photovoltage response, which is influenced by minority carrier lifetime variations as well as trapped charge and electric dipole distribution, the amplitude-normalized photocurrent response is influenced substantially only by the trapped charge or electric dipole distribution. Also, whereas the photovoltage response is substantially affected by second regions of a semiconductor device that are in electrical continuity with a first region of the device selected for studying, the photocurrent response obtained from such first regions is substantially independent of such second regions.

When CIS devices are the subject of study, the radiation intensity is preferably modulated so as to produce an alternating photocurrent, because the insulator on the semiconductor constitutes a high impedance path for direct current. Constant radiation intensity may be used when no insulating layer is present between the semiconductor and the conductor.

When photons having an energy greater than the band gap energy of the semiconductor are absorbed by the semiconductor, electrons from the valence band are excited into the (higher energy) conduction band. This produces mobile pairs of electrons and holes which drift in opposite directions in an electric field (produced by the bias potential), and this drift of electrical charge constitutes an electrical current that can be measured in an external measurement circuit.

When the devices being analyzed are CIS devices, however, the photocurrent cannot traverse the insulator. Instead, the photocurrent in time builds a stored photocharge (and corresponding photopotential) across the insulator capacitance. This photopotential counteracts the electrical field present within the semiconductor, and when the photopotential is of sufficient magnitude, no further photocurrent flows in the capacitively coupled circuit. When the illumination intensity is decreased, the stored photocharge will flow in the opposite direction within the capacitively coupled circuit in order to reestablish a new steady-state condition under lower intensity illumination conditions. This reverse flow of current is driven by the substantial concentration gradient of mobile electrons and holes produced within the semiconductor during the higher intensity illumination. Under steady-state conditions, where no net current flows within the circuit, the rate of drift of mobile charge within the electric field must be equal and opposite in sign to the rate of diffusion of mobile charge carriers due to their concentration gradients. An increase in illumination intensity alters the steady-state condition by increasing the number of mobile charge carriers available to drift in the electric field. Thus, an increase in illumination intensity also results in an increase in the concentration gradient of mobile charge carriers. Modulating the intensity of the probing radiation produces a time-varying concentration of mobile electron-hole pairs within the semiconductor, thereby producing the desired alternating photocurrent which may be measured in a capacitively coupled circuit, such as within a CIS semiconductor device.

When trapped charges are present within the insulator or at the insulator-semiconductor interface, these charges create corresponding electric fields within the semiconductor, thereby altering the electric field created by the bias potential alone. These alterations in the field are, of course, reflected in the photocurrent output when the semiconductor is illuminated. Moreover, when the trapped charges are distributed in spatially nonuniform patterns, they create corresponding nonuniform patterns of local electric fields within the semiconductor. Consequently, the photoresponse of the semiconductor device varies across its surface in accordance with the variations in the electric field.

In the ideal case where the device contains no trapped charges whatever, the photocurrent amplitude changes sharply at a single flat-band potential (similar to a step function). When the device contains a sufficient number of uniformly distributed trapped charges to create a uniform electric field within the plane of the space charge region of the semiconductor device, the response is similar to the ideal case except that the flat-band potential is shifted on the applied bias voltage axis. In contrast, when trapped charges or electric dipoles are distributed so as to create a nonuniform electric field within the semiconductor, the flatband potential will be different in different regions of the device. This effect may be manifested either as "stretch-out" of the photocurrent response over a wider range of applied bias potential or as the appearance of additional structure within the response curve. Consequently the difference between the actual photocurrent response and the ideal characteristic is a measure of the number and distribution of trapped charges or electric dipoles present at or near the semiconductor surface.

Figure 1:
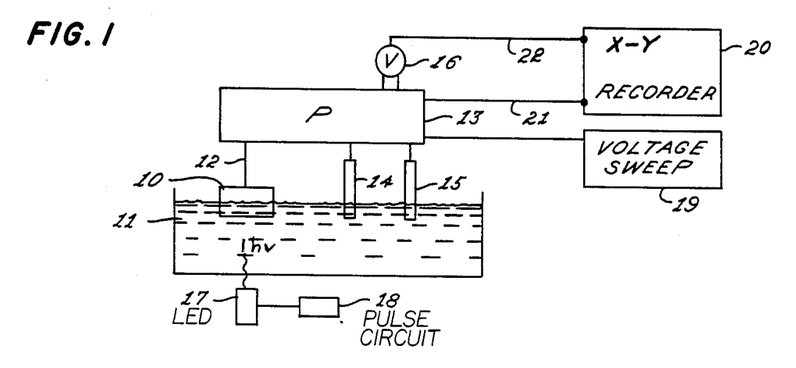
FIG. 1 is a first exemplary circuit for use in the method of the invention.

Referring now to the drawings and turning first to FIG. 1, one exemplary system for assaying a semiconductor system according to the present invention uses the semiconductor system as a sensing electrode 10 positioned at the surface of an aqueous medium 11. A lead 12 and potentiostat 13, e.g., Model 363 Potentiostat/Galvanostat PAR (Princeton Applied Research), connect the semiconductor electrode 10 to a reference electrode 14 and a controlling electrode 15. The potentiostat 13 supplies a bias current through the controlling electrode 15 and sensing electrode 10, which produces a polarizing potential or bias potential between the sensing electrode 10 and the reference electrode 14. This bias potential produced as a result of the bias current is measured by the potentiostat 13. The current required to maintain a predetermined bias potential between the electrodes 10 and 14 is recorded on a meter 16. A light-emitting diode (LED) 17 is controlled by a pulse circuit 18 to emit regular pulses of light at a predetermined frequency, thereby irradiating the semiconductor electrode 10 with modulated light which causes the semiconductor to produce an alternating photocurrent output when appropriately biased.

Additionally, a voltage sweep device 19, e.g., Model 3030 Sweep/Function Generator, BK-Precision Dynascan Corporation, Chicago, IL, may be used to vary or sweep the bias potential maintained between the electrodes 10 and 14 through a desired range in either a continuous or stepwise (digital) fashion. The amplitude of the alternating photocurrent then can be plotted as a function of the bias potential. An X-Y recorder 20, e.g., Model RE0088 PAR, may be used for this purpose. The magnitude of the bias potential is communicated to the X-Y recorder over a line 21, while the amplitude of the alternating photocurrent is communicated to the X-Y recorder over a line 22. The amplitude of the alternating photocurrent then may be analyzed as a function of the varying bias potential.

Figure 2:
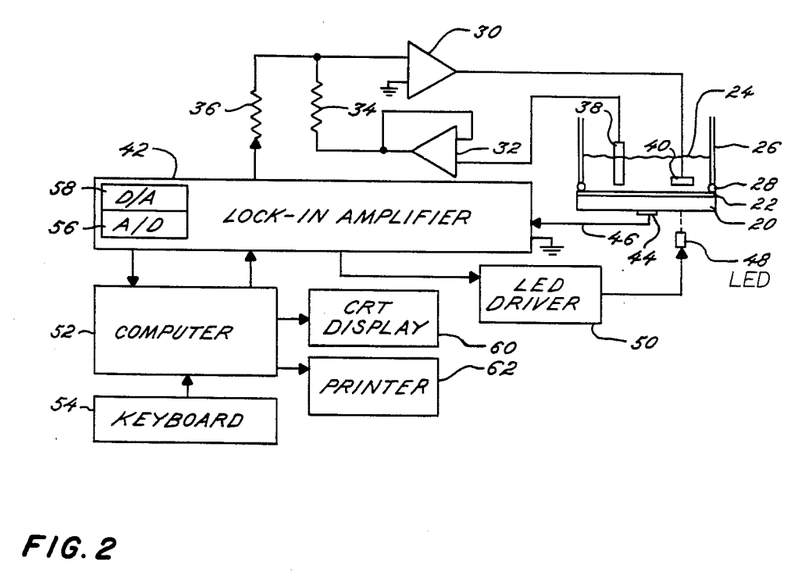
FIG. 2 is a schematic diagram of a computer-controlled controlled system which may be used to measure photocurrent in accordance with the present invention.

Shown in FIG. 2 is a schematic diagram of a computer-controlled apparatus which may be used to produce and measure a photocurrent in accordance with the present invention. A semiconductor wafer 20 is covered with an insulator 22 which is in contact with an electrolyte 24 enclosed by a chamber wall 26 sealed to the insulator surface by a rubber gasket 28. Operational amplifiers 30 and 32, together with resistors 34 and 36, reference electrode 38, controlling electrode 40, and a variable voltage source built into lock-in amplifier 42 function to determine the potential of the electrolyte with respect to the bulk of the semiconductor. The potential of the semiconductor bulk is held constant at virtual ground by an ohmic contact 44 attached to the underside of the semiconductor wafer 20 and to a copper lead 46 connected to the current input terminal of the lock-in amplifier 42 (model SR510, Stanford Research Systems, Palo Alto, Calif.). The ohmic contact 44 is made by scratching a eutectic mixture of indium and gallium into the semiconductor and contacting the mixture with the copper lead 46.

A light-emitting diode (LED) 48 is powered by an LED driver 50 so as to irradiate the semiconductor 20 with light of sinusoidally modulated intensity. The frequency of modulation is controlled by an oscillator circuit within the lock-in amplifier 42 which, in turn, is controlled by a computer 52 having a keyboard 54. Analog data is converted into digital form by an A/D converter 56 within the lock-in amplifier 42. Similarly, a D/A converter 58 converts digital instructions from the computer 52 into analog form which in turn controls various lock-in amplifier settings and the potential of the electrolyte 24 with respect to the semiconductor 20. Experimentally acquired data may be viewed on a CRT display 60 and permanently copied by a printer 62. An advantage of the lock-in amplifier 42 is that it may be set to reject signals of frequency or phase other than the desired signal, thus greatly improving the signal-to-noise ratio for very small signals.

The system of FIG. 2 was employed to examine a layer of insulating material coating one surface of a semiconductor wafer for the presence of, and the uniformity of distribution of, trapped charges and electric dipoles. Various types of insulated semiconductor specimens were used to demonstrate the effects of heterogeneous trapped charge distribution. Unless otherwise indicated, the electrolyte was an aqueous solution of 0.15M NaCl and 0.02M sodium phosphate, pH 7.0. The LED emitted at a peak wavelength of 880 nanometers (Radio Shack XC-880-A) and irradiated approximately 0.28 cm$^2$ of the semiconductor surface opposite the insulator. Unless otherwise indicated, the LED current was modulated from 0 to "100%" in a sinusoidal fashion at 10 kilohertz. The controlling electrode was a strip of platinum of about 0.2 cm$^2$ surface area, and the reference electrode was either a Ag/AgCl or alternatively a saturated calomel electrode (SCE).

The alternating photocurrent produced by the intensity-modulated irradiation of the semiconductor was measured by the lock-in amplifier 42 (Model SR510, Stanford Research Systems, Palo Alto, Calif.). The potential of the electrolyte 24 with respect to the semiconductor 20 was programmed to vary, i.e. swept digitally, at approximately 50-300 millivolts per second in steps of 5-50 millivolts per step starting at about 200-2000 millivolts on the accumulation side of the flat-band voltage and ending at about 200-2000 millivolts on the depletion side of the flat-band voltage. (The flat-band voltage is the applied potential necessary to produce zero, or minimum mean, electric field in the region of the semiconductor adjacent to the insulator. Accumulation conditions exist when the electric field is such that majority charge carriers accumulate in this region of the semiconductor, and depletion conditions exist when the electric field is such that majority charge carriers are depleted from this region.)

The amplitude of the alternating photocurrent is low when the semiconductor is biased into accumulation and approaches a maximum when the semiconductor is biased increasingly into depletion. The tracking bandpass filter of the lock-in amplifier is set to reject current signals which appear at frequencies other than the 10 kilohertz modulation frequency of the LED current. Additionally, the lock-in amplifier can be set to reject current signals that are out of phase with the photocurrent signal. To accomplish this, first the phase of the photocurrent signal is measured by the lock-in amplifier when the semiconductor is biased into the depletion region, where the alternating photocurrent signal is maximum. This measured phase is then selected for phase discrimination by the phase-sensitive detector within the lock-in amplifier. Subsequently, only this "in phase" component of the photocurrent is analyzed.

Figure 3:
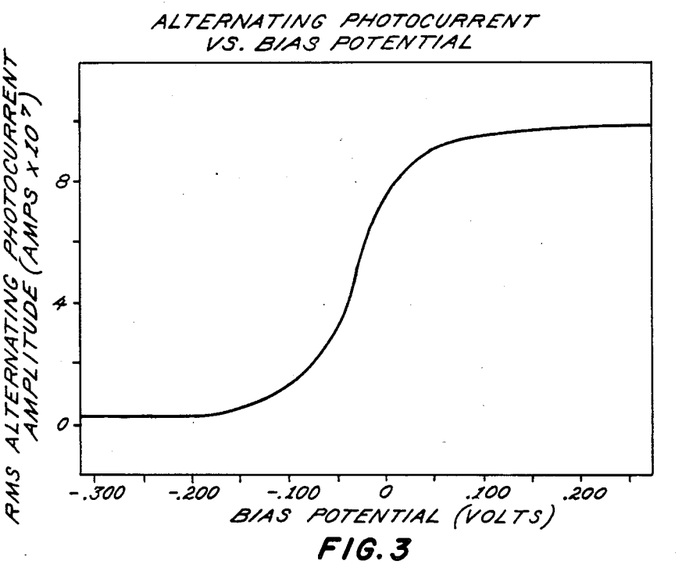
FIG. 3 is a plot of experimentally measured alternating photocurrent versus applied bias potential for a semiconductor with a relatively homogeneous distribution of trapped charge associated with an adjacent insulator.
Figure 4:
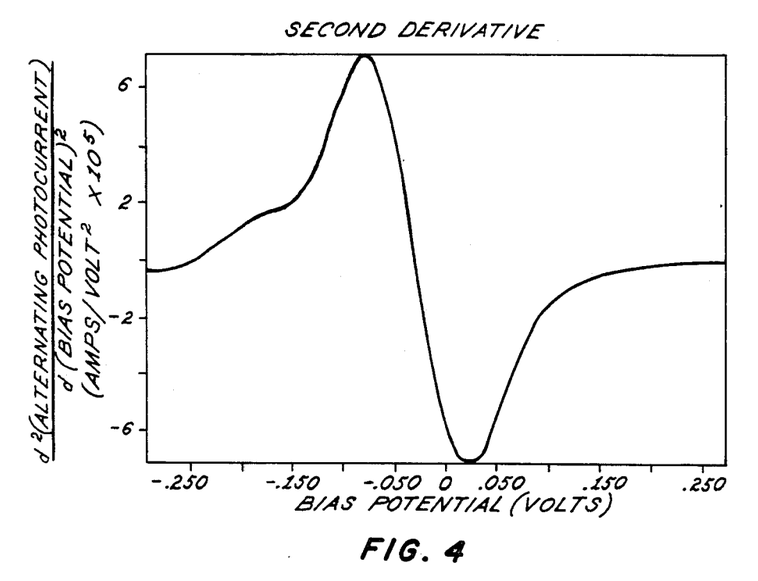
FIG. 4 is a plot of the second derivative of the data shown in FIG. 3.

An example of the data obtained with the use of both the bandpass filter and the phase-sensitive detector is shown in FIG. 3, and the second derivative of this data is shown in FIG. 4. The semiconductor was P100 silicon of approximately 12 to 17 ohm-cm resistivity. The amplitude of the modulated LED flux was adjusted by regulating the LED current so that the maximum alternating photocurrent obtained was approximately 1 microamp (RMS). The insulator was composed of a 340-angstrom layer of silicon oxide adjacent to the silicon and overlaid with about 800 angstroms silicon nitride, and the device was annealed in a way that minimized the heterogeneity of trapped charge distribution. As can be seen from FIG. 3, the amplitude of the alternating photocurrent is relatively low when a negative bias potential is applied, which biases the p-type semiconductor into accumulation. As a more positive bias potential is applied, passing through the flat-band potential, the amplitude of the alternating photocurrent increases, approaching a maximum value at increasingly positive bias potentials where the p-type semiconductor is biased into depletion. The result is a characteristic, sigmoidally shaped curve.

The sharpness of the response, or more precisely, the change in applied bias potential necessary to cause a transition from a low measured photocurrent to a high measured photocurrent, is indicative of the uniformity of the electric field within the semiconductor space charge region. The more uniform the electric field, the sharper the transition will be. A nonuniform electrical field may be created by a nonuniform density of trapped charges or electric dipoles near the semiconductor surface. It can be seen that the bias potential difference separating the maximum and minimum in the second derivative curve of FIG. 4 is relatively small, e.g., 100 millivolts. This indicates that the electric field within the semiconductor of the device which yielded the curve of FIG. 3. is quite uniform, and the effect of trapped charges on this uniformity is minor. That is, either very few trapped charges are present or they are very uniformly distributed.

Figure 5:
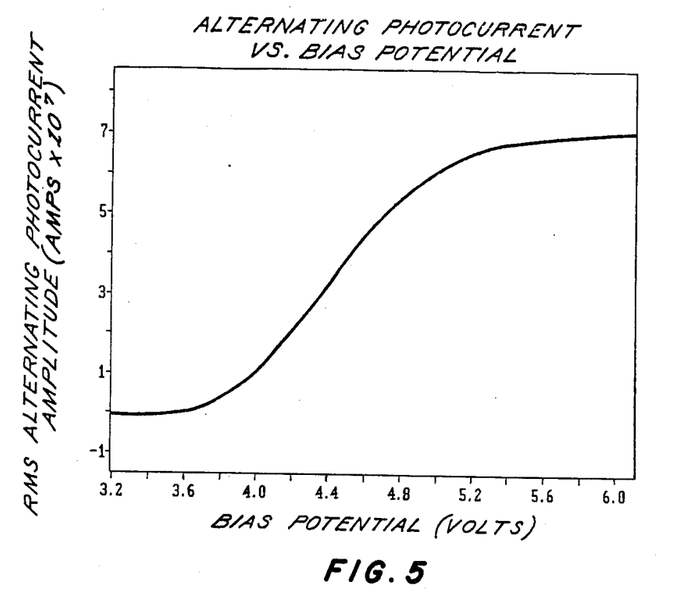
FIG. 5 is a plot of experimentally measured alternating photocurrent versus applied bias potential for a semiconductor with a nonuniform and non-random distribution of trapped charge associated with an adjacent insulator.
Figure 6:
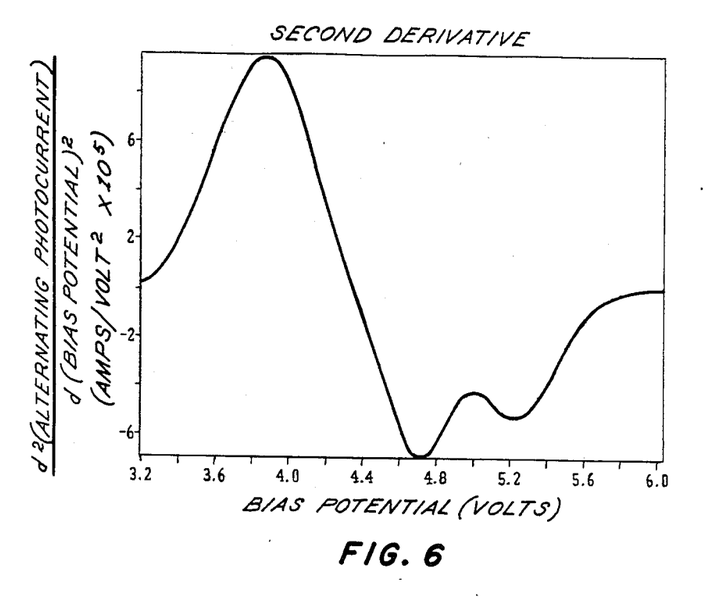
FIG. 6 is a plot of the second derivative of the data shown in FIG. 5.

FIG. 5 illustrates the same response curve for a semiconductor device having a more nonuniform distribution of trapped charges. The two semiconductor devices that gave the results shown in FIGS. 3 and 5 were identical except that the former received a post-fabrication annealing treatment that was more effective in removing the trapped charges present within the insulator or at the semiconductor-insulator interface. The primary data shown in FIG. 5 and, more clearly, the second derivative of this data shown in FIG. 6, show three effects of trapped charges or electric dipoles. First, there is a shift of the photocurrent response with respect to bias potential. For example, the second derivative shown in FIG. 4 crosses zero at about minus 40 millivolts, whereas the same zero-crossing point for the device with a high concentration of trapped charge is at about 4300 millivolts, a difference of over 4 volts. Secondly, the photocurrent response is "stretched out" along the bias potential axis. The voltage difference between the maximum and minimum of the second derivative shown in FIG. 4 is about 100 millivolts, whereas the corresponding value observed for the device with more trapped charge (FIG. 6) is about 840 millivolts. A third characteristic of trapped charge also is seen in FIGS. 5 and 6, that is, the appearance of additional structure in the photocurrent vs. applied bias potential (or derivative) plots. Particularly notable is the second minimum in the second derivative plot shown in FIG. 6. Such additional structure is characteristic of locally high electric fields in the semiconductor with respect to surrounding regions. This effect can be produced, for example, by clusters of trapped charge or electric dipoles within the insulator or at the insulator-semiconductor interface.

The difference between the curves of FIGS. 3 and 5, or FIGS. 4 and 6, provides a quantitative evaluation of the nonuniformity of the distribution of trapped charges in the device characterized by the curve of FIG. 5. This evaluation is useful as a quality control tool for fabricators or users of semiconductor devices, and is particularly useful when the semiconductor devices are to be used in applications where the uniformity of distribution of trapped charges has a significant influence on the performance of the semiconductor device.

In the foregoing analysis, it is assumed that the insulator is of uniform thickness and of uniform capacitance. Variation in the uniformity of insulator capacitance within the illuminated region can cause experimental effects similar to those described above; thus the general method disclosed here also may be used to measure variation in insulator capacitance which, in turn, may be caused by variation in either insulator thickness or variation in insulator dielectric constant. Other techniques, such as reflection spectroscopy, may be used to measure the uniformity of insulator capacitance (F. Reizman and W. Van Gelder, "Optical Thickness Measurement of $SiO_2$-$Si_3N_4$ Films on Silicon," *Solid State Electron.*, Vol. 10, p. 625, 1967). Thus, in conjunction with such other techniques it may be deduced whether the changes in the photocurrent response observed are due to changes in trapped charge or electric dipole distribution or are due to variations in insulator capacitance.

A number of different techniques may be used to quantify the "stretch-out" of a photocurrent characteristic such as the one illustrated in FIG. 5. One particular technique that has been demonstrated to yield accurate results is to take the second derivative of the actual curve and determine the bias potential difference between the maximum and minimum values of the second derivative. In the case of normally distributed trapped charges or electric dipoles, this voltage difference can be shown to represent twice the measured standard deviation in variation of flat-band potential ($\Sigma_{fb}$) within the illuminated region of the semiconductor device. This value $\Sigma_{fb}$ may be used to determine a uniformity parameter, $\Sigma_q$ defined by the equation $\Sigma_q = \Sigma_{fb} C_i/q$, where $\Sigma_{fb}$ is the measured standard deviation in flat-band potential, $C_i$ is the capacitance between the plane of trapped charge and the conductor (per unit area), and q is the elementary electronic charge value of $1.602 \times 10^{-19}$ coulombs.

In addition to monitoring the distribution of trapped charges associated with insulators on semiconductors, the method of this invention may be used to examine the physical nature of the trapped charges. Such information is obtained by irradiation of the semiconductor with extremely low levels of modulated light intensity and comparison of the resulting measured data with that obtained under higher levels of modulated (either partially or completely) light intensity. The appearance of additional structure in either the primary data or derivative curves under conditions of low illumination intensity is indicative of the presence of interfacial trapped charges, otherwise known as "surface states" or "fast states", because these interfacial charge trapping sites fill and empty rapidly as the concentration of free electrons or holes is changed at the insulator-semiconductor interface. Modulation of the irradiation intensity results in a corresponding modulation of the concentration of electrons or holes at the semiconductor-insulator interface and therefore results in the periodic filling and emptying of these charged sites. This produces a light-modulation-dependent interfacial trap current, which can be suppressed by superimposing a high-intensity illumination background upon the modulated LED intensity. Typically, this is accomplished with a single illumination source, such as a single LED, by partial (about 5%) modulation of the total LED current. (With 5% modulation, the constant illumination component of the LED irradiation is about 20 times more intense than the modulated component.) Under these conditions the interface traps are nearly saturated by the photogenerated charge carriers produced by the continuous illumination and are not available for emptying and filling during modulation of the charge carrier concentration upon modulation of the light intensity.

Figure 7:
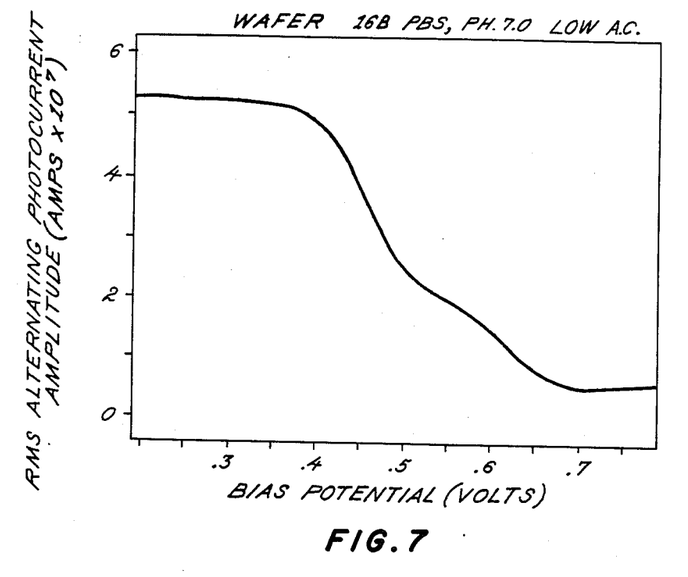
FIG. 7 is a plot of experimentally measured alternating photocurrent versus applied bias potential for a semiconductor system with interfacial trapped charge or "fast states", measured under modulated "low intensity" illumination.
Figure 8:
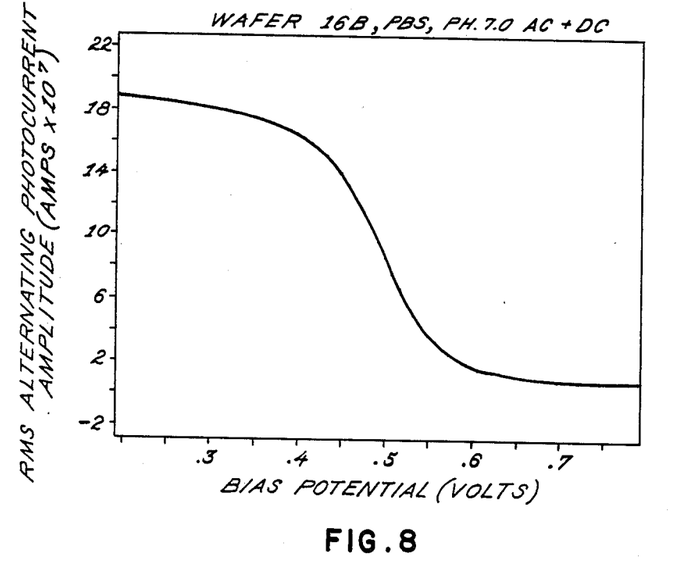
FIG. 8 is a plot of experimentally measured data obtained in the same manner as the data in FIG. 7 except that continuous illumination was present, in addition to modulated light.
Figure 9:
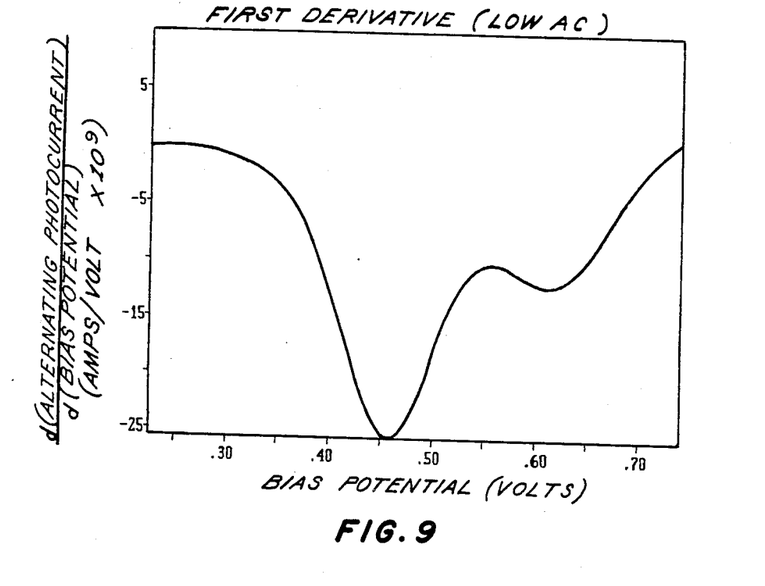
FIG. 9 is a plot of the first derivative of the data shown in FIG. 7.
Figure 10:
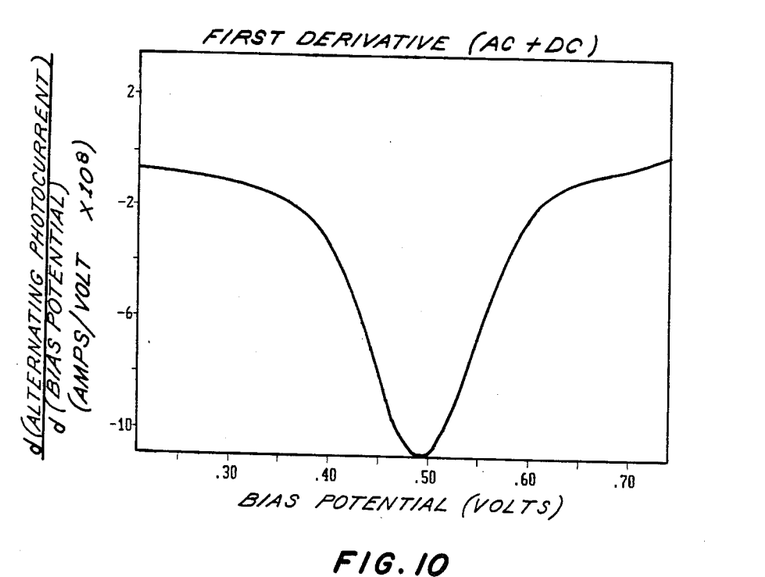
FIG. 10 is a plot of the first derivative of the data shown in FIG. 8.

Shown in FIGS. 7 through 10 are results of measurements carried out as described above on a semiconductor device that was fabricated in a way that created interfacial trapped charges or "fast states". The semiconductor is N100, 15-21.65 ohm-cm resistivity; the insulator is composed of about 330 angstroms of silicon oxide, adjacent to the silicon, and about 800 angstroms of silicon nitride. FIG. 7 shows the result of a measurement carried out under low illumination intensity conditions where the LED was 100% modulated and the photon flux was limited to give a maximum photocurrent of approximately 5 nanoamps (RMS). Note the additional structure in the photocurrent curve compared to FIG. 8 where an identical measurement was carried out on the same region of the same semiconductor except that continuous illumination was additionally obtained from the LED by passing a continuous current through the LED. The continuous current was 20 times greater than the peak-to-peak amplitude of the modulated component of the current described above. In FIGS. 9 and 10 are shown the first derivatives of the data shown in FIGS. 7 and 8, respectively. The second minimum in the first derivative curve shown in FIG. 9 is indicative of trapped charges present as interfacial trapped charge or "fast states". This second minimum was not observed under conditions of higher intensity, partially modulated illumination, as seen in FIG. 10.

Figure 11:
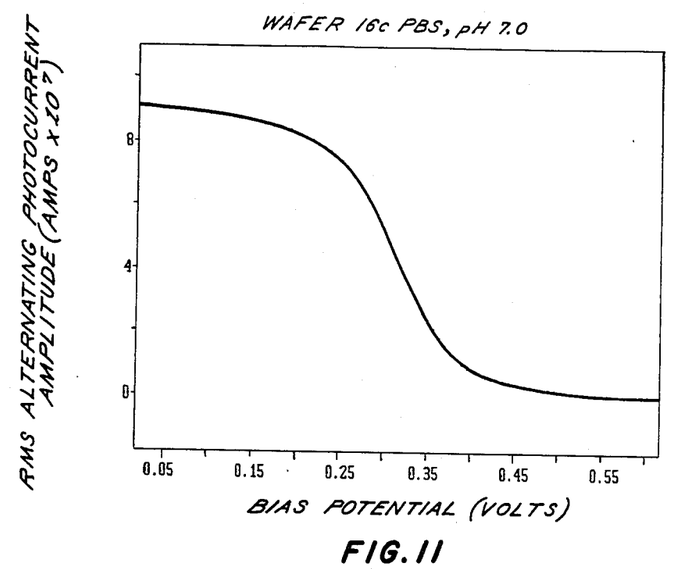
FIG. 11 is a plot of experimentally measured alternating photocurrent versus applied bias potential for a semiconductor with only a small amount of trapped charge associated with an adjacent insulator.
Figure 12:
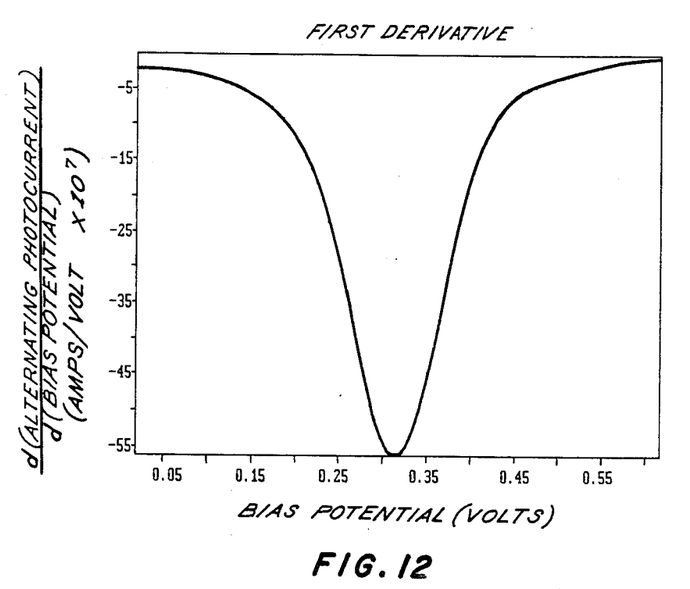
FIG. 12 is a plot of the first derivative of the data shown in FIG. 11.
Figure 13:
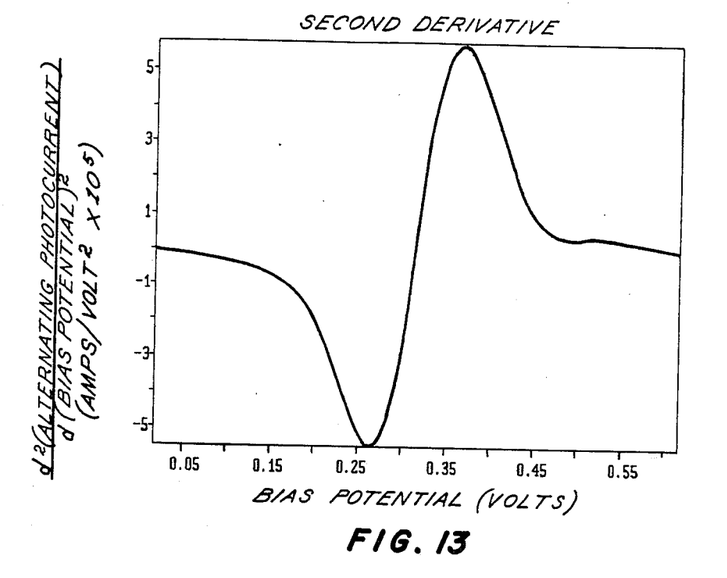
FIG. 13 is a plot of the second derivative of the data shown in FIG. 11.

In order to further demonstrate the method of analyzing semiconductor systems, the foregoing measurements were carried out both before and after injection of charge into a semiconductor device. The apparatus shown in FIG. 2 was again employed for the measurements. The semiconductor and insulator of the semiconductor device was similar to that employed to produce the measurements shown in FIGS. 7–10. The results of measurements carried out prior to charge injection are shown in FIGS. 11 through 13 which are the primary photocurrent vs. bias potential response and the first and second derivatives of this response, respectively. It can be seen that the transition is quite sharp, with FIG. 13 showing a value of about 55 millivolts for $\Sigma_{fb}$. It can also be seen that the transition is smooth with a single minimum and single maximum in the second derivative (FIG. 13). Interfacial trapped charge analysis was carried out as described above with results (not shown) similar to that shown in FIGS. 7–10. Thus, a detectable but small number of interfacial trapped charges were present prior to charge injection.

Figure 14:
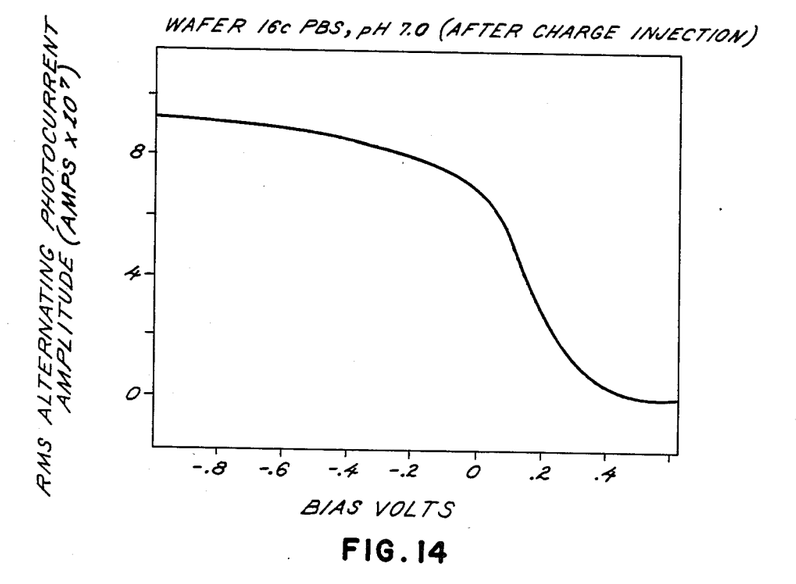
FIG. 14 is a plot of experimentally measured alternating photocurrent versus applied bias potential for the same semiconductor system used to produce the data in FIGS. 11-13 after that system was injected with a charge to produce a large amount of trapped charge having a nonrandom heterogeneous distribution.
Figure 15:
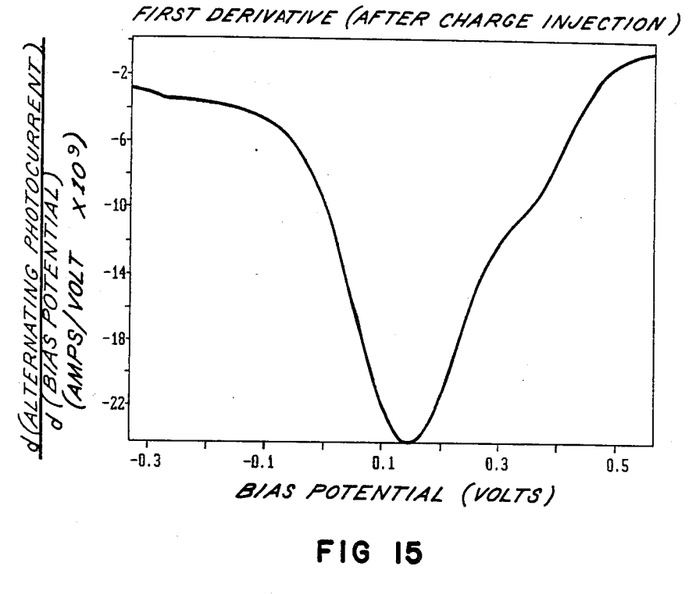
FIG. 15 is a plot of the first derivative of the data shown in FIG. 14.
Figure 16:
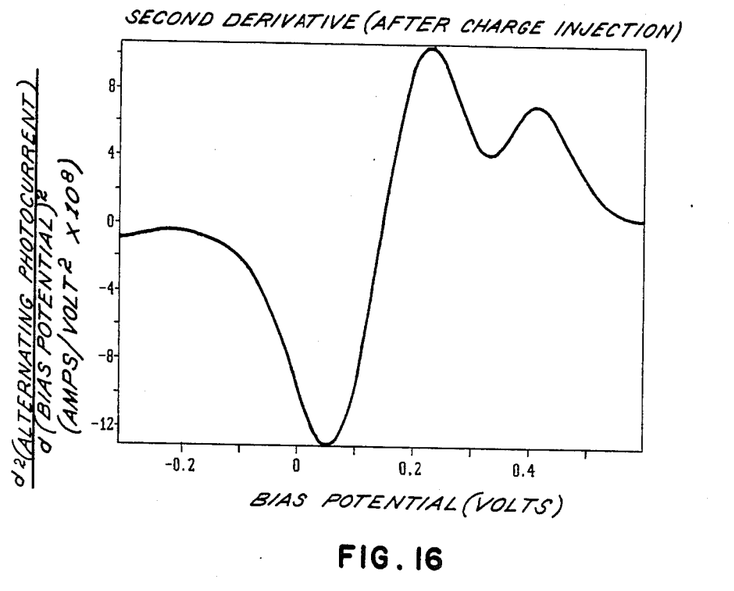
FIG. 16 is a plot of the second derivative of the data shown in FIG. 14.

Next, charge was injected into the semiconductor device by applying 15 volts of bias potential from the reference electrode through the electrolyte, which in this case was 0.05M potassium biphthalate, pH 4.0 (Fisher Cat. No. SO-B-101), to the semiconductor. The very high electric field (about $1.5 \times 10^6$ volts/cm) within the insulator causes charge to be injected into the insulator. Injection of trapped charge was detected by repeating the measurements described above. The results are shown in FIGS. 14–16 in the primary photocurrent vs. applied bias potential response and the first and second derivatives of this response, respectively. Compared to the results prior to charge injection, it is clear that the primary photocurrent response curve has been shifted to a more negative bias potential. For example, the minimum in the first derivative plot before charge injection occurs at about 320 millivolts (FIG. 12), whereas the same minimum after charge injection occurs at about 140 millivolts (FIG. 15). Thus, the shift in flatband potential $\Delta_{fb}$ due to charge injection is about 180 millivolts. This indicates either that the trapped charge is positive in sign or that the direction of electric dipoles created within the insulator is positive with respect to the semiconductor. Also particularly striking is the appearance of the shoulder in the first derivative plot (FIG. 15) and the second maximum in the second derivative plot (FIG. 16). This additional structure indicates that the injected charge has not been deposited in a way so as to create uniform electric field within the semiconductor. Rather it appears that charge has been injected into some regions of the semiconductor, leaving other regions unaffected. From the above measured shift in flatband potential ($\Delta_{fb}$), an estimate of the density of injected charge ($D_i$) may be obtained as $D_i = \Delta_{fb} C_i/q$. A minimum estimate of injected trapped charge density $D_{i(min)}$ is obtained by assuming that all trapped charges reside at the insulator-semiconductor interface. Thus, $C_i$ becomes the insulator capacitance (in this case about 0.05 ($\mu$fd/cm$^2$) and $D_{i(min)}$ is determined as:

$$D_{i(min)} = \frac{0.180 \text{ volts} \times 0.05 \text{ } \mu fd/cm^2}{1.6 \times 10^{-19} \text{ coulombs}} = 5.6 \times 10^{10}/cm^2$$

The Debye length $L_D$, a characteristic length for semiconductors, is equal to:

$$L_D = (\Sigma_s kT/q^2 N_B)^{\frac{1}{2}}$$

where $\Sigma_s$ is the semiconductor permittivity, k is the Boltzmann constant, T is the absolute temperature, and $N_B$ is the concentration of electron acceptor or donor impurities (dopant) within a p- or n-type semiconductor, respectively. For the semiconductor used in the present experiment, $L_D$ is approximately 3000 angstroms. Within the semiconductor the electric field surrounding a point charge falls to a low (insignificant) value at distances farther than $L_d$ from the point charge due to the electrostatic screening by dopant charges. Using the value calculated above for $D_{i(min)}$, the minimum number of injected charges residing in an area $L_D^2$ at the semiconductor surface can be determined as:

$$D_{i(min)}(L_D)^2 = 5.6 \times 10^{10}/cm^2 \times 9 \times 10^{-10} cm^2 \approx 50$$

Because this value is considerably greater than unity, and from the shape of the curves of FIGS. 15 and 16 showing more than a single population of deposited charge density, it can be determined that the injected charge is present in a highly nonuniform, or clustered fashion.

Measurements with low intensity illumination were repeated after charge injection in order to determine whether the injected charge was present as interfacial trapped charge, i.e., as "fast states". The procedure was similar to that described above for interfacial trapped charge analysis. The results (not shown) were similar to those observed previously in a region of the semiconductor where no charge was injected. Thus, the injected charge predominately is not of the interfacial trap or "fast state" type. Comparison with measurements made under low intensity illumination prior to charge injection revealed that the photocurrent component due to interfacial trapped charges was significantly smaller after charge injection. Thus, it would appear that charge injection resulted in a decrease in interfacial trapped charges with a concomitant increase in fixed charges.

The possibility that the charge was injected as mobile ions was not addressed experimentally, but the following is a convenient method to address this possibility. The presence of mobile charge may be detected by monitoring the photocurrent vs. applied bias potential response both before and after applying a relatively large positive electric field across the insulator for a period of time and then again after applying a relatively large negative electric field across the insulator for a period of time. This field, however, should not be so large so as to create electrical breakdown or sustained polarization effects within the insulator. (In the example discussed above, this may be achieved by first applying about +1 volt, with respect to the flatband potential, from the electrolyte to the semiconductor for a period of 20 minutes and then remeasuring the photocurrent vs. applied bias potential response. This procedure is then repeated after similarly applying minus 1 volt with respect to the flatband potential for the same period of time.) If the results of the photocurrent vs. bias potential measurements are found to be identical both before and after both positive and negative potential bias applications, it may be concluded that the charge associated with the insulator is not mobile at the temperature under which potential bias was applied. This test may be repeated at various temperatures in order to determine the temperature-dependence of charge mobility (if observed). If no charge mobility is observed, it may be concluded that charges present either within the insulator or at the insulator-semiconductor interface are not present as mobile charges. Together with the previous experimental evidence which ruled out the possibility that the injected charge predominately was present as interfacial trapped charge, by the process of elimination these charges then must be present as positive fixed charges or as an electric dipole with the positive pole oriented toward the semiconductor. Furthermore, from the foregoing analysis of the density and distribution of trapped charges, it may be concluded that these fixed charges or electric dipoles are present in the form of clusters. If on the other hand, the injected charges were determined to be present as mobile charges in the preceding step, the foregoing results would indicate that these charges must be present as clusters of mobile positive charge.

From the above exemplary analysis, it should be clear that various results and combinations of results are possible with semiconductor devices with various densities of associated trapped charge or electric dipoles of various types. Thus, the disclosed method has value for the diagnosis and measurement and diagnosis of many different types of trapped charge and electric dipoles in such devices.

The method of this invention may be used to test semiconductor devices in a variety of different sizes and shapes, varying from chip size, which may have its largest dimension of about 0.1 mm, or wafer size, which may be 300 mm, more usually not more than about 150 mm, in its largest dimension. The device will usually have at least one smooth surface or smooth portion of a surface, desirably flat, which will serve as the irradiation site. The device may be round, rectangular, elongate or the like. The thickness of the device will generally be not more than about 5 mm, usually less than about 1 mm, and generally not less than about 0.05$\mu$, usually not less than 0.1 mm.

Irradiation of the photoresponsive element may be on any side of the element. However, where the irradiation occurs on the side opposite to the side associated with the interface of interest, the material must be sufficiently thin, or the irradiation sufficiently penetrating, that the photogenerated charge carriers are able to be influenced by the electric field within the region of interest. This may be accomplished, however, by allowing light absorption to occur in a region of the semiconductor distant from the region of interest and providing for diffusion of the photogenerated charge carriers into the region of interest. Such provision ordinarily requires that the lifetime of photogenerated charge carriers be sufficiently long to allow diffusion of these carriers over the required distance. Similarly, the frequency of intensity modulation (if any) of the irradiation must be such that sufficient time is allowed within each modulation period to allow for diffusion of these carriers over the required distance.

The light source can be any convenient source, but the irradiation energy, at least partially, must be absorbed by the photoresponsive element. Light absorbed by the photoresponsive element results in electronic transitions which produce an increase in the number of charge carriers (electrons and holes). The electronic transitions may be either intrinsic (band to band) or extrinsic (involving forbidden gap energy levels). For intrinsic transitions, the long wavelength cutoff is given by:

$$\lambda c = hc/Eg$$
$$= 1.24/Eg$$

where $\lambda c$ is the wavelength, in microns, corresponding to the semiconductor band gap energy Eg, in electron volts (Sze, S.M., *Physics of Semiconductor Devices*, 2nd. Ed., 1981, New York, John Wiley, Co.). Light of wavelength shorter than $\lambda c$ is absorbed by the semiconductor, and electron-hole pairs are generated in the process. For extrinsic transitions light of wavelength longer than $\lambda c$ may be absorbed by the semiconductor, resulting in an electronic transition between a band edge and an electronic level in the energy gap. Electron-hole pairs are formed likewise upon the absorption of photons, but for such extrinsic transitions the photon energy need only be greater than the energy separation of the band gap levels and the conduction or valence bands. Such extrinsic transitions are complex processes and are often phonon assisted.

Additionally, an increased concentration of electron-hole pairs may be formed within the desired local region of a semiconductor system by locally heating the region of interest. By this thermal method, the energy per photon is no longer of consequence, but instead the absolute power absorbed within the region of interest is important.

Any source of light may be used to provide the light or the intensity-modulated light, particularly a source which can provide for modulation of the light intensity at a predetermined frequency, e.g., 100 Hz–100 kHz, usually 100 Hz–50 kHz, more usually 1–20 kHz, during the period of irradiation. Relevant sources of light include light-emitting diodes (LEDs) or LED arrays, lasers, incandescent lamps, and fluorescent lamps. Of particular interest are LEDs, especially infrared LEDs, and diode lasers. Alternatively, any source of light, including sunlight, may be employed in conjunction with shutters to produce an optical beam of time-varying intensity. Nematic liquid crystals, gratings, optical fibers, choppers, or the like, may also find application in the shutter mechanism.

The absorbtion coefficient of various semiconductor materials is strongly dependent upon the wavelength of light (H. Melchior, "Demodulation and Photodetection Techniques", in F. T. Arecchi and E. O. Schulz-Dubois, Eds., *Laser Handbook*, Vol. 1, North Holland, Amsterdam, 1972, pp. 725–835).

One may take advantage of this effect to control the depth of penetration of the excitation light into the semiconductor, and thus control the region of the semiconductor device effectively probed by the light. For example, if the semiconductor interface of interest is irradiated directly, and the interfacing materials, except for the semiconductor, are transparent to the light; light of short wavelength may be employed for shallow penetration, and light of longer wavelength for deeper penetration, into the semiconductor device. Thus, in conjunction with the method provided by this invention for examination of the electric fields and their uniformity within semiconductor devices, the wavelength of irradiation may be selected to provide for examination of electric fields present at various depths within the semiconductor device. In this application it will be advantageous to employ semiconductor materials with sufficiently short minority carrier lifetime that photogenerated charge carriers diffuse only very short distances before recombination. For example, in silicon semiconductors, the minority carrier lifetime may be tailored to the required value by incorporation of the proper concentration of gold into the silicon (W. M. Bullis, "Properties of Gold in Silicon", *Solid State Electron.*, 9, 143, 1966). The diameter (or area) of the probed area of the semiconductor device similarly may be defined by the irradiation wavelength and the minority carrier lifetime of the semiconductor device.

In order to probe very small areas of the semiconductor device, the following three conditions are desirable: (a) the diameter or cross sectional area of the excitation beam should be small; (b) the wavelength of the irradiating light should be short in order to provide for a shallow penetration depth; and (c) the minority carrier lifetime should be short so as to minimize the diffusion length of minority carriers generated by the light beam. In general, the lower limit for the irradiation wavelength will be determined by the interfering light absorption by materials through which the light must pass before entering the semiconductor. Also, it will generally be desirable to use wavelengths of electromagnetic radiation with insufficient energy to produce long-lived charged species within the semiconductor system.

Simultaneous irradiation of different sites may be employed, where a means is used to allow for distinguishing the signals, such as a phase shift, alternating frequencies, or other combinations where the signals can be segregated.

One can inspect incremental portions by irradiating a site on the photoresponsive element associated with the particular incremental portion. Irradiation of a particular site among a multiplicity of such sites may be achieved by employing a light source which irradiates successive sites, by movement of the light source and the photoresponsive surface in relation to one another. Alternatively, one may employ a plurality of light sources which irradiate different portions of the photoresponsive element or elements in accordance with a predetermined schedule. Also, combinations of the two alternatives may be employed. In this way, one can address different portions of the device to determine variations in the state of the device over a large volume or area.

Various electrodes of a variety of materials may be used, so long as the materials of the electrode do not adversely affect the photoresponsive electrode, are not adversely affected by the electrically communicating medium, and do not adversely affect the electrically communicating medium. Illustrative electrodes include such materials as platinum, rhodium, palladium, silver—silver chloride, calomel, conducting glass electrode ($SnO_2$, $InO_2$ or ITO), etc. In some instances it may be desirable to encase the electrode in an electrically communicating shield, e.g., gelatin.

In the simplest case the counter electrode will consist of a conductive substance, such as metal, brought adjacent either to the semiconductor surface or to an insulator, which in turn is substantially adjacent to the semiconductor. For example, measurement systems of the type shown in FIG. 2 may be modified by omitting the reference electrode 38, the controlling electrode 40, the rubber gasket 28, and the electrolyte 24, or various combinations thereof, and replacing them with a counter electrode comprising a single metal or a highly doped semiconductor. The resulting free leads from operational amplifiers 30 and 32 are shorted together and used to contact the counter electrode. Such a configuration is convenient for analysis of, for example, MIS, MOS, and Schottky diode semiconductor devices.

In cases where the measured photocurrent is an alternating current, the controlling electrode may be capacitively coupled to the conductive medium rather than directly coupled. In this case any small amounts of direct current required to maintain polarization of the conductive medium may be supplied by the conductivity of the reference electrode. Such capacitively coupled controlling electrodes may be composed of insulating material coated onto a conductor. Examples are aluminum oxide on aluminum, silicon oxide on doped silicon, tantalum oxide on tantalum, titanium oxide on titanium, silicon nitride on doped silicon, and the like. Alternatively, mixtures or composite layers of such insulators over a conductive substance may be employed.

In one embodiment, there are three electrodes, the sensing electrode, a reference electrode and a controlling electrode. The potential between the sensing electrode and the reference electrode can be varied by varying the potential applied to the controlling electrode with respect to the sensing electrode. The light emitting diode or other light source is powered with an external electronic circuit so as to emit light which varies in a regular pattern, e.g., square-wave, sine-wave, etc., in intensity with time, resulting in a time dependent response of the sensing electrode, which can be detected by measuring the current through the controlling electrode required to maintain a predetermined polarizing voltage between the sensing electrode and the reference electrode.

It is usually convenient to convert the photogenerated current into a voltage signal for quantitation by voltage-measuring instrumentation. For example, the measurement systems shown in FIG. 1 and FIG. 2 accomplish this task in the potentiostat 13 and the lock-in amplifier 42, respectively. The preferred method for this conversion is to configure an operational amplifier as a current-to-voltage converter. Alternatively, the photocurrent may be passed through an impedance in the form of a resistor, a capacitor, or an inductor, so that the magnitude of the photocurrent can be measured as a voltage drop across the impedance. In these three cases, the measured voltage drop will be in phase, lagging, and leading the photocurrent, respectively. Alternatively, other properties, such as a magnetic field due to the photocurrent, may be measured. It will be obvious to those skilled in the art of electrical measurements that various combinations of such circuits or devices may be employed for the primary measurement of the photocurrent.

What is claimed is:

1. A method of analyzing selected regions of a semiconductor system, said method suitable to determine the uniformity of distribution of structural defects at the surface of the semiconductor, said method also suitable to determine the uniformity of distribution of structural defects in a dielectric material associated with the surface of the semiconductor, said method comprising the steps of:
    applying an adjustable bias potential to a semiconductor system to produce an electric field within the semiconductor system,
    directing a beam of electromagnetic radiation onto a selected region of the semiconductor system in which said electric field exists to induce a photocurrent output from the semiconductor system,
    adjusting said bias potential to vary one or more charateristics of said electric field, said characteristics selected from the group of characteristics consisting of direction and magnitude,
    measuring the photocurrent output induced by said beam as a function of said bias potential, and
    determining the uniformly of distribution of structural defects in said selected region of the semiconductor system from said measured photocurrent output.

2. The method of claim 1 wherein said bias potential is adjusted over a range that includes a flat-band potential of the semiconductor system.

3. The method of claim 1 wherein said uniformity of distribution of structural defects is determined by the deviation of the measured values of said photocurrent output from values predetermined to be characteristic of a reference semiconductor system.

4. The method of claim 1 wherein intensity of said beam of electromagnetic radiation is modulated over time so as to produce an alternating photocurrent output from the semiconductor system, and said measuring step measures the amplitude or phase of the alternating photocurrent output induced by modulation of said beam at different levels of said bias potential.

5. The method of claim 1 wherein said semiconductor system is a conductor-insulator-semiconductor system.

6. The method of claim 5 wherein said conductor is a metal.

7. The method of claim 5 wherein said insulator is a material selected from the group consisting of silicon oxides and silicon nitrides, and said semiconductor is a material selected from the group consisting of silcon and impurity-doped silicon.

8. The method of claim 1 wherein said electromagnetic radiation is light having a wavelength in a range of from about 0.1 micron to about 1.2 micron.

9. The method of claim 1 wherein said electromagnetic radiation is selected to have a wavelength which provides a predetermined depth of light penetration into said semiconductor system.

10. The method of claim 1 wherein minority carrier lifetime within said semiconductor is selected to provide said selected region of the semiconductor system with a predetermined depth of penetration or a predetermined lateral area.

11. The method as in claim 1 wherein said structural defects are selected from the group of structural defects consisting of trapped charges and electric dipoles.

12. The method of claim 3 wherein said reference semiconductor system is selected from the group of semiconductor system having uniformly distributed structural defects and having no structural defects.

13. The method as in claim 12 wherein said structural defects are selected from the group of structural defects consisting of trapped charges and electric dipoles.

14. A method of analyzing a conductor-insulator-semiconductor (CIS) system for the uniformly of distribution of trapped charges or electric dipoles therein, said method comprising the steps of:
    applying an adjustable bias potential to the CIS system to produce an electric field within said system,
    directing a beam of electromagnetic radiation onto at least a selected region of the CIS system in which said electric field exists to induce a photocurrent output from the CIS system,
    adjusting said bias potential to vary one or more characteristics of said electric field, said characteristics selected from the group of characteristics consisting of direction and magnitude, said bias potential being adjusted over a range that includes a flat-band potential of said system,
    modulating the intensity of said beam at a known frequency to produce an alternating photocurrent output from the CIS system, the intensity and the frequency of modulation of said beam being such that the amplitude of said alternating photocurrent output is approximately proportional to the intensity of said beam,
    measuring said alternating photocurrent output for different characteristics of bias potential, said characteristics selected from the group of characteristics consisting of direction and magnitude, and
    determining the deviation of the measured values of said alternating photocurrent output from values predetermined to be characteristic of a CIS system with uniformly distributed trapped charges or electric dipoles, or no trapped charges or electric dipoles.

15. The method of claim 14 wherein said step of measuring comprises the step of measuring the amplitude of said alternating current output.

16. The method of claim 14 wherein said measuring step measures the phase of said alternating current output.

17. The method of claim 14 wherein the conductor of said CIS system is a metal.

18. The method of claim 14 wherein the conductor of said CIS system is an electrolyte.

19. The method of claim 14 wherein the insulator of said CIS system is a material selected from the group consisting of silicon oxides and silicon nitrides, and said semiconductor is a material selected from the group consisting of silicon and impurity-doped silicon.

20. A method of determining the physical nature of trapped charges in selected regions of a semiconductor system, said method comprising the steps of:
    applying an adjustable bias potential to a semiconductor system to produce an electric field within the semiconductor system,
    directing a low-intensity beam of electromagnetic radiation onto a selected region of the semiconductor system in which said electric field exists to induce a first photocurrent output from the semiconductor system,
    adjusting said bias potential to vary one or more characteristics of said electric field, said characteristics selected from the group of characteristics consisting of direction and magnitude,
    modulating substantially the entire intensity of said beam at a first prescribed frequency so that said first photocurrent output from the semiconductor system is an alternating current, measuring said first alternating photocurrent output for different characteristics of bias potential, said characteristics selected from the group of characteristics consisting of direction and magnitude, while said modulated beam is directed onto said selection region, said first prescribed frequency and intensity of said low-intensity beam being such that interfacial trapped charges in said selected region affect said first alternating photocurrent output, directing a high-intensity beam of electromagnetic radiation onto said selected region of the semiconductor system in which said electric field exists to induce a second photocurrent output from the semiconductor system, adjusting said bias potential to vary one or more characteristics of said electric field, said characteristics selected from the characteristics consisting of direction and magnitude, modulating a fraction of the intensity of said high-intensity beam at a second prescribed frequency so that said second photocurrent output from the semiconductor system is an alternating current, measuring said second alternating photocurrent output at different magnitudes or directions of bias potential while said modulated beam is directed onto said selected region, the fraction of intensity that is modulated, the second prescribed frequency, and the intensity of said high-intensity beam being such that interfacial trapped charges in said region have substantially no effect on said second alternating photocurrent output, and determining the deviation of said second alternating photocurrent output from said first alternating photocurrent output to ascertain whether the semiconductor system includes interfacial trapped charges.

21. The method of claim 20 wherein said first prescribed frequency and said second prescribed frequency are substantially the same.

22. The method of claim 22 wherein said semiconductor system includes a conductor, an insulator, and a semiconductor.

23. The method of claim 21 wherein said semiconductor is a material selected from the group consisting of silicon and impurity-doped silicon, the insulator is a material selected from the group consisting of silicon oxide and silicon nitride, and the conductor is a material selected from the group consisting of highly doped silicon, degenerately doped silicon, and metals.

* * * * *